(12) United States Patent
Knowles

(10) Patent No.: US 6,426,538 B1
(45) Date of Patent: Jul. 30, 2002

(54) SUSPENDED MICROMACHINED STRUCTURE

(75) Inventor: Gary R. Knowles, Ham Lake, MN (US)

(73) Assignee: Honeywell International Inc., Morristown, NJ (US)

(*) Notice: Subject to any disclaimer, the term of this patent is extended or adjusted under 35 U.S.C. 154(b) by 0 days.

(21) Appl. No.: 09/761,291

(22) Filed: Jan. 16, 2001

(51) Int. Cl.[7] .............................................. H01L 29/82
(52) U.S. Cl. ........................... 257/417; 73/504; 73/505; 73/514; 73/651; 257/252; 257/254; 257/415; 257/417; 257/419; 257/420; 257/418; 438/52; 438/50
(58) Field of Search ................................. 257/419, 420, 257/415, 417, 418, 252, 254; 73/504.12, 651, 504, 505, 514; 438/53, 50, 52

(56) References Cited

U.S. PATENT DOCUMENTS

| 5,203,208 | A |   | 4/1993  | Bernstein           |
|-----------|---|---|---------|---------------------|
| 5,734,105 | A | * | 3/1998  | Mizukoshi ... 73/504.02 |
| 5,821,596 | A | * | 10/1998 | Miu et al. ... 257/419 |
| 5,992,233 | A | * | 11/1999 | Clark ... 73/514.35 |
| 6,060,336 | A | * | 5/2000  | Wan ... 438/50 |
| 6,067,858 | A |   | 5/2000  | Clark et al.        |
| 6,070,463 | A | * | 6/2000  | Moriya et al. ... 73/504.12 |
| 6,122,691 | A |   | 9/2000  | Geen et al.         |

* cited by examiner

Primary Examiner—Eddie Lee
Assistant Examiner—Edgardo Ortiz
(74) Attorney, Agent, or Firm—Dennis C. Bremer

(57) ABSTRACT

A suspended micromachined structure including a proof mass and multiple support arms configured to suspend the mass above a substrate. At least one support arm may include two spring elements, each attached to the substrate as well as to a rigid lateral element. Thus, there may be three points of attachment along each lateral element. These points of attachment create three effective flexure points along each rigid lateral element that allow the proof mass to move with a great deal of freedom axially, parallel to the substrate. The linearity of the spring constant that acts on the proof mass may be improved.

24 Claims, 3 Drawing Sheets

SUSPENDED MICROMACHINED STRUCTURE

BACKGROUND OF THE INVENTION

1. Field of the Invention

The present invention relates to micromachined devices and, more particularly, to a suspension system for micromachined devices.

2. Description of Related Art

Recent advances in micromachining have enabled the manufacture of various microelectromechanical systems (MEMS) that offer potential performance and cost improvements over existing non-micromachined devices. MEMS devices may be manufactured on a large scale using photolithographic techniques to etch silicon wafers, in much the same way that traditional microelectronic integrated circuits are produced in the electronics industry. In silicon-based MEMS devices fabricated using conventional integrated circuit techniques, three-dimensional structures can be integrated with electronic circuitry on the same chip, offering great potential for improvements of sensors, actuators, and other devices. Initially, MEMS devices were strictly silicon-based, like microelectronic devices, but today the term represents complete miniature devices that may or may not be silicon-based, and that can be produced using methods other than photolithographic techniques.

One MEMS device is a micro-electromechanical system gyroscope (MEMS gyro). The MEMS gyro consists of one or more oscillating proof masses that may be suspended above a substrate by spring elements mounted to the substrate. The proof mass is made to oscillate at a precise frequency axially and parallel to the substrate by an electronic drive mechanism. As used herein, the term "proof mass" is defined broadly to include any mass suitable for use in a MEMS system. The MEMS gyro functions by sensing the coriolis acceleration that acts on the oscillating proof mass when the gyro is rotated. Further, the substrate typically has a recess below the proof mass that allows the gyro to oscillate freely above the substrate. The recess may be formed in the substrate by deposition of a photoresist mask that allows the substrate to be selectively etched.

When spring elements are used to suspend a proof mass above a substrate, at least one end of the spring element is typically mounted to the substrate, and the other end is typically attached to the proof mass. Because one end is fixed, and also because micro-machined structures do not have pin joints, a spring element must typically stretch as well as bend when the proof mass oscillates axially. Adding spring elasticity to each of the spring elements used to suspend a proof mass can accommodate this stretching.

When proof masses are mounted so that their spring elements must stretch to allow movement, however, the resulting spring constants in the direction of oscillation are non-linear. Non-linear spring constants can introduce frequency shifts if the amplitude of the mass' oscillation varies. Such frequency shifts are undesirable, as they can affect the accuracy of a MEMS gyroscope. Moreover, the performance of any micromachined device that employs a movable mass may be adversely affected by a non-linear spring constant in the suspension system. Thus, a suspension system with a more linear spring constant could provide improved performance in micromachined devices.

In addition, suspending a proof mass with a spring element that is configured to stretch and also to bend as the proof mass oscillates allows some freedom of motion in directions other than the direction in which the proof mass was designed to oscillate. Such freedom of motion is undesirable, can adversely affect measurements made by the gyro and, if it is great enough, may even damage or destroy the gyro if a portion of the proof mass collides with a stationary element of the gyro. Thus, a suspension system that allows great freedom of motion along one axis, while significantly restricting motion in any other direction in the plane of the substrate may provide improved reliability and performance in micromachined devices.

SUMMARY OF THE INVENTION

A suspended micromachined structure is disclosed. The structure may include a movable proof mass, and multiple support arms configured to suspend the proof mass above a substrate. Each support arm may include one or more spring elements and at least one rigid lateral element.

Preferably, the proof mass is integrally connected to a rigid lateral element of each of four support arms suspending the proof mass above the substrate. Each support arm preferably includes a rigid lateral element having spring elements extending therefrom. The spring elements may in turn be attached to the substrate at two points, and each rigid lateral element of the support arms may be attached to the proof mass at one point. Preferably, the spring elements are attached to opposite ends of each rigid lateral element. In addition, the proof mass is preferably attached to the center of the rigid lateral element. Thus, there are preferably three points of attachment on the rigid lateral element. These points of attachment create three effective flexure points or flexure points for each support arm along each rigid lateral element. Thus, there is a flexure point at the intersection of the proof mass and the rigid lateral element, as well as at the intersection of the rigid lateral elements with the respective spring elements.

The effective flexure points of the support arms may be configured to allow the proof mass to move with a great deal of freedom axially, parallel to the substrate, while allowing substantially less freedom of movement in any other direction within a plane parallel to the substrate. Further, the support arms may be configured so that the spring constants that act on the proof mass result from bending of the spring elements, greatly improving the linearity of the net spring constant of the suspension system. In such a system, the flexure point associated with the point of attachment between the proof mass and the rigid lateral element moves in a linear direction parallel to the axial direction of motion of the proof mass, allowing for improved performance of the gyro.

These as well as other aspects and advantages of the present invention will become apparent to those of ordinary skill in the art by reading the following detailed description, with appropriate reference to the accompanying drawings.

BRIEF DESCRIPTION OF THE DRAWINGS

Exemplary embodiments of the present invention are described herein with reference to the drawing, in which.

DETAILED DESCRIPTION OF AN EXEMPLARY EMBODIMENT

Figure 1:
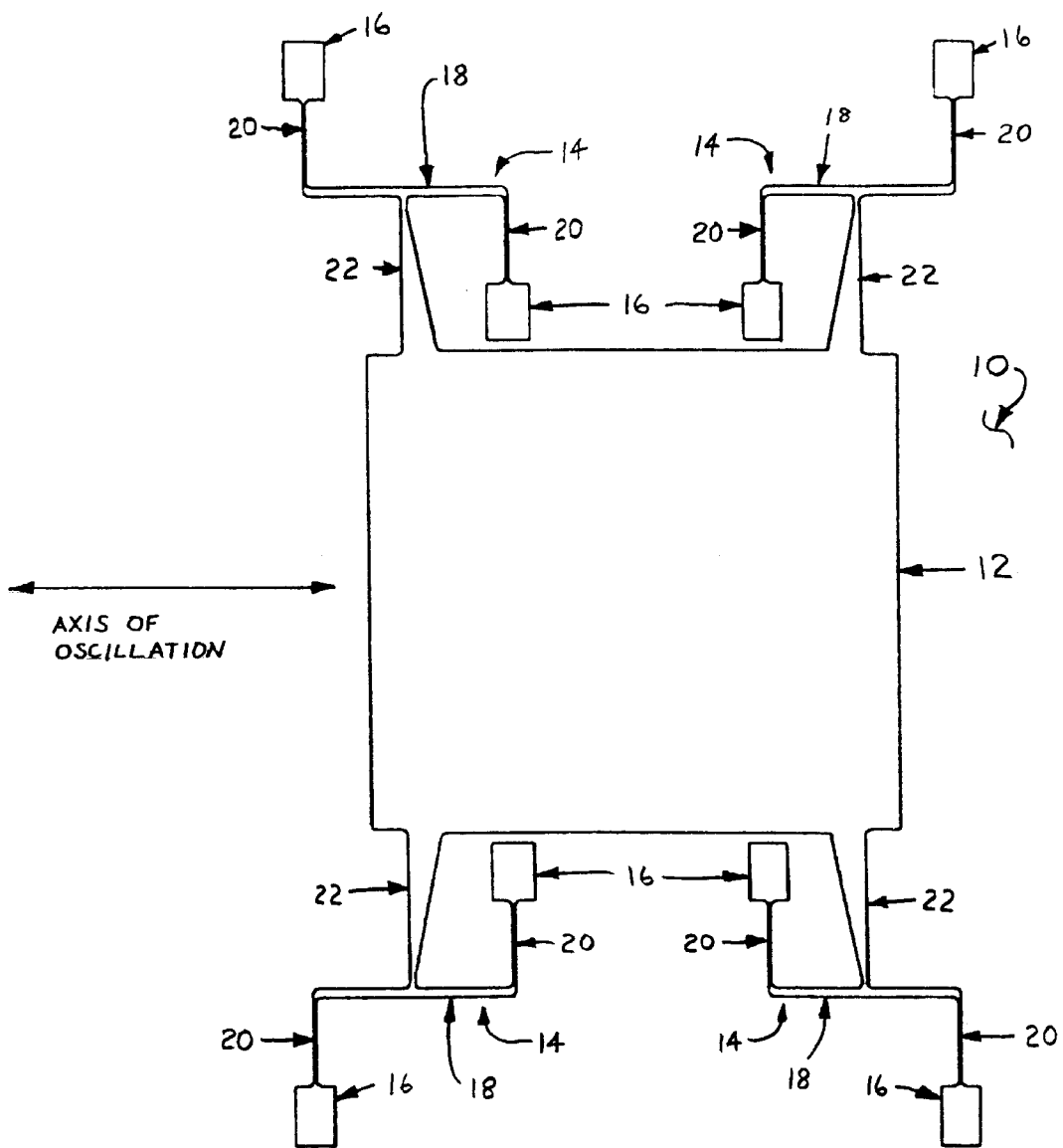
FIG. 1 is a plan view of a proof mass and suspension system of the present invention, with drive and sense elements omitted for clarity.

Referring to the drawings, FIG. 1 is a plan view of the present invention. Micromachined proof mass 12 may be suspended above substrate 10 by four support arms 14. The invention, however, would also function even if fewer (or more) than four support arms were used, and even if fewer or more than all of the support arms were configured as shown in FIG. 1. Proof mass 12 and support arms 14 may be integrally formed using any suitable micromachining technique. Proof mass 12 is connected to each support arm 14 by a connecting arm 22 that intersects each support arm 14 at a point along rigid lateral element 18. Each support arm 14 is connected to substrate 10 at two attachment points 16 via spring elements 20 extending from respective ends of each rigid lateral element 18. During operation, proof mass 12 oscillates along the axis of oscillation shown. In the preferred embodiment, the MEMS gyroscope of the present invention may be fabricated from a single, unitary silicon substrate, but this is neither required nor a limitation of the invention as it is contemplated; a MEMS gyroscope may be fabricated from various materials known to be suitable for micromachining, such as silicon, polycrystalline silicon, and other crystalline or amorphous materials. Also, although only one proof mass is shown, the invention is equally applicable to MEMS gyros having two or more proof masses that oscillate in opposition to each other for the purpose of canceling undesirable vibrations in the substrate and providing greater sensitivity, since the displacement of each proof mass may be measured by the system.

Figure 2:
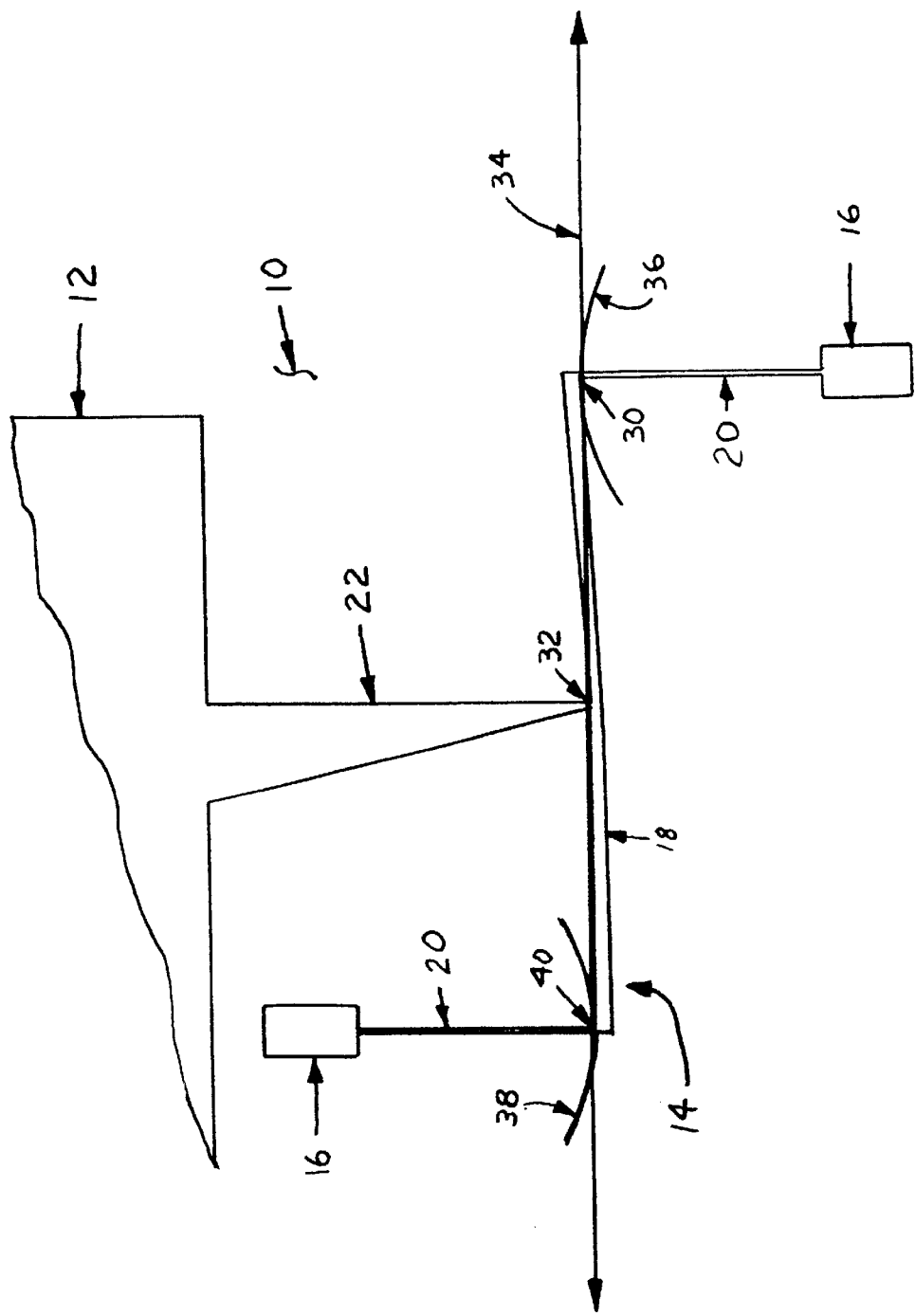
FIG. 2 is a detailed view of one support arm of the present invention suspending the proof mass above the substrate with the proof mass in its undisplaced (i.e., centered) position.

FIG. 2 shows one of the support arms 14 in greater detail, and also illustrates the principle of operation of the invention. Each support arm 14 includes two spring elements 20 and a rigid lateral element 18, where the spring elements 20 are attached to substrate 10 at two attachment points 16. Rigid lateral element 18 is relatively wider and thus more rigid than spring elements 20. Further, connecting arm 22 of proof mass 12 is designed to be narrow where it attaches to rigid lateral element 18. Due to this design, there are three effective flexure points associated with each rigid lateral element 18: two end flexure points 30 where each spring element 16 meets an end of the rigid lateral element 18, and a middle flexure point 32, where connecting arm 22 meets the center of the rigid lateral element 18. Effective flexure points act as pivoting joints, or pin joints, would in a larger mechanical system.

The effective flexure points 30 and 32 can be determined by a finite element modeling program, such as ANSYS. The symmetrical design of the suspension system creates an axis of alignment 34. To minimize the overall flexure of the suspension system, the three flexure points 30 and 32 should lie on a straight line that is co-linear with axis of alignment 34.

If the three flexure points of each rigid lateral element 18 lie along axis of alignment 34, the overall flexure of the suspension system will be minimized. Moreover, since each support arm 14 is symmetrical about axis of alignment 34, each middle flexure point 32 will have substantially more freedom of motion along its axis of alignment 34 than in any other direction in the plane parallel to substrate 10. This principle will be described in greater detail below. Further, even if each support arm 14 is not symmetrical but the design has the overall configuration shown, it is still possible to achieve a highly linear spring rate and a greater degree of freedom of motion of middle flexure point 32 along an axis of alignment than in any other direction in the plane parallel to substrate 10. In other words, perfect symmetry is not required for the proper functioning of the invention.

Preferably, the axes of alignment 34 of all four support arms 14 will be parallel. Thus, the greater freedom of motion that each middle flexure point 32 has along its axis of alignment 34 will tend to confine the proof mass to an axis of oscillation that is parallel to the axes of alignment 34, since the proof mass 12 is preferably connected to each support arm 14 at a middle flexure point 32.

Figure 3:
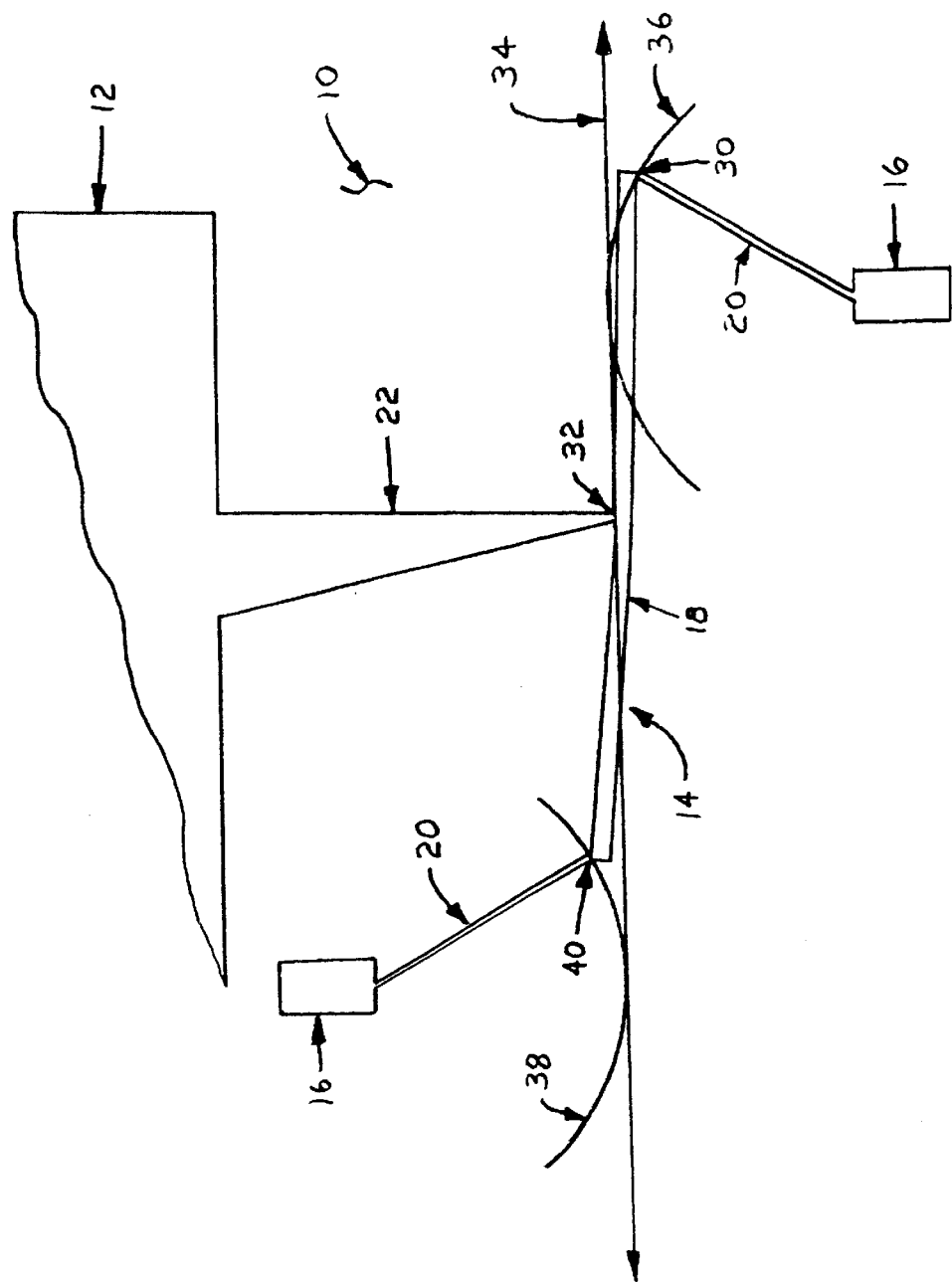
FIG. 3 is a detailed view of one support arm of the present invention showing in exaggerated fashion the position-relationship between the proof mass and a support arm as the proof mass is displaced from its center position.

When a driving force is exerted on proof mass 12 in the general direction of the axis of oscillation by an electrical drive system (not shown), it will be displaced to the left or right of the center position shown in FIG. 2. As proof mass 12 is displaced, for example, to the right (as shown in FIG. 3 in exaggerated form), the right spring element 20 will also move to the right. As right spring element 20 moves to the right, its flexure point 30 will travel along radius of travel 36. At the same time, the left spring element 20 will also move to the right, and its flexure point 40 will travel along its radius of travel 38.

Since end flexure points 30 and 40 move along their respective radii of travel 36 and 38 (and not along axis of alignment 34), rigid lateral element 18 will rotate in the clockwise direction as proof mass 12 is displaced in either direction away from the center position of the system, and rigid lateral element 18 will rotate in the counter-clockwise direction as proof mass 12 moves toward the centered position.

Importantly, though, as the proof mass moves along the axis of oscillation, the middle flexure point 32 will also remain on and travel along axis of alignment 34, since support arm 14 is symmetrical about middle flexure point 32. Because support arm 14 is symmetrical, each end of rigid lateral element 18 is displaced the same distance away from axis of alignment 34 as the other end (in the opposite directions) with the result that middle flexure point 32 travels along axis of alignment 34.

Although it would not be optimal for keeping flexure at a minimum, middle flexure point 32 will still travel in a straight line along the axis of alignment 34 as long as support arms 14 are symmetrical (that is, even if the three flexure points lie on a straight line that is not parallel to the axis of alignment 34 associated with a particular support arm 14).

Restricting proof mass 12 to travel along the axis of oscillation is desirable because non-linear motion could cause proof mass 12 to either crash into stationary structures (not shown) attached to substrate 10, or to adversely affect the accuracy of the sensor due to the undesirable change in the positional relationship between the proof mass and the sensing elements of the device (not shown). The restriction on the motion of proof mass 12 is limited to motion in a plane co-planar to substrate 10. In other words, proof mass 12 cannot easily rotate (for example) within a plane parallel to substrate 10, but it has (and must have) some freedom to move in either direction perpendicular to substrate 10, since such out-of-plane motion results from the torques and accelerations that are ultimately measured by the MEMS gyro.

With the configuration depicted in Figures, rigid lateral element 18 is free to rotate about its middle flexure point 32 due to the geometry of the system, as described above, elongation of spring elements 20 is limited or eliminated when allowing proof mass 12 to move along the axis of oscillation. Instead, spring elements 20 flex at their effective flexure points 30 and 40 to allow proof mass 12 to move as desired. This flexure with limited or no elongation of spring elements 20 results in a net spring constant acting on proof mass 12 that is much more linear than it would be if it were necessary for spring elements 20 to elongate as well as bend in order to allow proof mass 12 to oscillate. In the Figures shown, four support arms are shown having the described geometry. It should be understood that a greater or fewer number of support arms of this configuration could be used. While not optimal, even using one support arm of this type of configuration will improve the linearity of the net spring constant of the system and tend to improve the intended path of oscillation of the proof mass.

A linear spring constant is desirable for any sensor employing an oscillating proof mass because a linear spring constant tends to keep the proof mass oscillating at a more precise frequency even if the amplitude of oscillation changes. Precise frequency control improves sensor accuracy and sensitivity and also simplifies the electronic drive system used for oscillating mass sensors.

Exemplary embodiments of the present invention have been illustrated and described. It will be understood, however, that changes and modifications may be made to the invention without deviating from the spirit and scope of the invention, as defined by the following claims.

The embodiments of the invention in which an exclusive property or right is claimed are defined as follows:

1. A micromachined device comprising:
   a movable mass;
   a plurality of support arms attached to the movable mass;
   each of the support arms flexibly coupling the movable mass to a substrate;
   at least on e of the support arms including a first end coupled to the substrate and a second end coupled to the substrate;
   wherein the movable mass is connected to the at least one support arm at a point between the first end and the second end of the support arm.

2. The micromachined device of claim 1, wherein the at least one support arm comprises:
   a first spring element attached to the substrate;
   a second spring element attached to the substrate;
   a rigid lateral element having a first end and a second end, the first end of the rigid lateral element connected to the first spring element and the second end o f the rigid lateral element connected to the second spring element;
   wherein the movable mass is connected to the rigid lateral element of the at least one support arm between the first and second ends of the rigid lateral element.

3. The micromachined device of claim 2, wherein the movable mass is connected to the middle of the rigid lateral element.

4. The micromachined device of claim 2 wherein the connection of the first spring element to the rigid lateral element creates a first end flexure point, the connection of the second spring element to the rigid lateral element creates a second end flexure point, and the connection of the movable mass to the rigid lateral element creates a middle flexure point.

5. The micromachined device of claim 4, wherein the first end flexure point, the second end flexure point, and the middle flexure point form a substantially straight line.

6. The micromachined device of claim 5, wherein the substantially straight line comprises an axis of alignment.

7. The micromachined device of claim 6, wherein the axis of alignment is parallel to an axis of oscillation of the movable mass.

8. The micromachined device of claim 7, wherein when the movable mass moves along the axis of oscillation, the middle flexure point moves along the axis of alignment.

9. The micromachined device of claim 1, further including a second support arm having a first end coupled to the substrate and a second end coupled to the substrate; wherein the movable mass is connected to the second support arm at a point between the first end and the second end of the support arm.

10. The micromachined device of claim 9, wherein the at least one support arm and the second support arm are positioned on the same side of the movable mass.

11. The micromachined device of claim 9, wherein the at least on support arm and the second support arm are positioned on opposite sides of the movable mass.

12. The micromachined device of claim 6, wherein the first and second spring elements are symmetrical about the axis of alignment.

13. A micromachined device comprising:
   a movable mass having first and second sides;
   a first support arm extending from the first side of the movable mass;
   a second support arm extending from the second side of the movable mass;
   each of the support arms flexibly coupling the movable mass to a substrate;
   each of the support arms includes a first end coupled to the substrate and a second end coupled to the substrate;
   wherein the movable mass is connected to each of the support arms at a point between the first end and the second end of the support arm.

14. The micromachined device of claim 13, wherein each of the support arms comprise:
   a first spring element attached to the substrate;
   a second spring element attached to the substrate;
   a rigid lateral element having a first end and a second end, the first end of the rigid lateral element connected to the first spring element and the second end of the rigid lateral element connected to a second spring element;
   wherein the movable mass is connected to the rigid lateral element of each support arm between the first and second ends of the rigid lateral elements.

15. The micromachined device of claim 14, wherein the movable mass is connected to the middle of each of the rigid lateral elements.

16. The micromachined device of claim 14, wherein for each support arm the connection of the first spring element to the rigid lateral element creates a first end flexure point, the connection of the second spring element to the rigid lateral element creates a second end flexure point, and the connection of the movable mass to the rigid lateral element creates a third flexure point.

17. The micromachined device of claim 16, wherein the first end flexure point, the second end flexure point, and the middle flexure point for each support arm forms a substantially straight line.

18. The micromachined device of claim 17, wherein the substantially straight line for each support arm comprises an axis of alignment.

19. The micromachined device of claim 18, wherein the axis of alignment for each support arm is parallel to every other support arm's axis of alignment.

20. The micromachined device of claim 19, wherein when the movable mass moves along the axis of oscillation, the middle flexure point of each support arm moves along its respective axis of alignment.

21. A micromachined device comprising:

a movable mass having four connecting arms; and four support arms, each of the support arms extending from a respective connecting arm, the support arms flexibly coupling the movable mass to a substrate;

each of the four support arms including a first end connected to the substrate, a second end connected to the substrate, and a rigid lateral element;

each rigid lateral element including a first end and a second end, the first end of the rigid lateral element connected to a first spring element and the second end of the rigid lateral element connected to a second spring element;

each connecting arm of the movable mass being connected to each rigid lateral element between the first and second ends of each rigid lateral element;

wherein the connection of the first spring element to each rigid lateral element creates a first end flexure point, the connection of the second spring element to each rigid lateral element creates a second end flexure point, and the connection of each connecting arm to each rigid lateral element creates a middle flexure point.

22. The device of claim 21, wherein the three flexure points of each support arm are aligned in a substantially straight line that comprises an axis of alignment.

23. The device of claim 22, wherein each axis of alignment of the four support arms are parallel to each other and to an axis of oscillation of the movable mass.

24. The device of claim 22, wherein the middle flexure point of each support arm moves along its respective axis of alignment when the movable mass moves along the axis of oscillation.

* * * * *